US011087825B2

(12) United States Patent
Choi et al.

(10) Patent No.: US 11,087,825 B2
(45) Date of Patent: Aug. 10, 2021

(54) SEMICONDUCTOR MEMORY DEVICE FOR REDUCING SNAPBACK CURRENT OF NON-VOLATILE MEMORY DURING READ OPERATION

(71) Applicants: SK hynix Inc., Icheon (KR); Seoul National University R&DB Foundation, Seoul (KR)

(72) Inventors: Hong Seok Choi, Seoul (KR); Hyungrok Do, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/712,737

(22) Filed: Dec. 12, 2019

(65) Prior Publication Data

US 2020/0395062 A1 Dec. 17, 2020

(30) Foreign Application Priority Data

Jun. 11, 2019 (KR) .................. 10-2019-0069001

(51) Int. Cl.
| | | |
|---|---|---|
| G11C 11/408 | (2006.01) |
| G11C 11/4094 | (2006.01) |
| G11C 11/4074 | (2006.01) |
| G11C 11/4091 | (2006.01) |
| G11C 13/00 | (2006.01) |
| G11C 7/06 | (2006.01) |

(52) U.S. Cl.
CPC ...... *G11C 11/4087* (2013.01); *G11C 11/4074* (2013.01); *G11C 11/4085* (2013.01); *G11C 11/4091* (2013.01); *G11C 11/4094* (2013.01); *G11C 13/0004* (2013.01); *G11C 13/004* (2013.01); *G11C 13/0033* (2013.01); *G11C 7/062* (2013.01); *G11C 13/0061* (2013.01)

(58) Field of Classification Search
CPC ............ G11C 13/0004; G11C 13/0026; G11C 13/0028; G11C 13/0038; G11C 13/0069; G11C 13/0033; G11C 13/004; G11C 7/062; G11C 13/0061
See application file for complete search history.

(56) References Cited

U.S. PATENT DOCUMENTS

| | | | |
|---|---|---|---|
| 6,597,598 B1 | 7/2003 | Tran et al. | |
| 9,286,975 B2 * | 3/2016 | Chu | G11C 13/0033 |
| 9,478,286 B1 | 10/2016 | Mantegazza et al. | |
| 9,627,055 B1 | 4/2017 | Robustelli | |

(Continued)

*Primary Examiner* — Mushfique Siddique

(57) ABSTRACT

A semiconductor memory device includes a bitline driver configured to drive a global bitline; a memory cell array including a first memory cell that is coupled between a cell wordline and a cell bitline; a bitline decoder including a bitline switch that couples the global bitline and the cell bitline; a wordline decoder including a wordline switch that couples a global wordline and the cell wordline; a sense amplifier configured to output a sensing signal corresponding to a state of the first memory cell based on a voltage of the global bitline; and a control circuit configured to control the bitline driver, the bitline decoder, the wordline decoder and the sense amplifier during a first read operation for the first memory cell.

17 Claims, 9 Drawing Sheets

(56) References Cited

U.S. PATENT DOCUMENTS

| | | | |
|---|---|---|---|
| 2004/0233748 A1* | 11/2004 | Terao | H01L 27/2463 |
| | | | 365/202 |
| 2006/0227592 A1 | 10/2006 | Parkinson et al. | |
| 2009/0097336 A1* | 4/2009 | Kang | G11C 11/5678 |
| | | | 365/189.14 |
| 2015/0243355 A1* | 8/2015 | Lee | G11C 13/0069 |
| | | | 365/148 |
| 2018/0059938 A1* | 3/2018 | Kang | G11C 7/065 |
| 2018/0158524 A1* | 6/2018 | Shin | G11C 13/0033 |
| 2019/0115079 A1* | 4/2019 | Park | G11C 13/0004 |
| 2020/0013459 A1* | 1/2020 | Do | G11C 13/0004 |
| 2020/0194067 A1* | 6/2020 | Park | G11C 13/0004 |

* cited by examiner

SEMICONDUCTOR MEMORY DEVICE FOR REDUCING SNAPBACK CURRENT OF NON-VOLATILE MEMORY DURING READ OPERATION

CROSS-REFERENCE TO RELATED APPLICATION

The present application claims priority under 35 U.S.C. § 119(a) to Korean Patent Application No. 10-2019-0069001, filed on Jun. 11, 2019, which are incorporated herein by reference in its entirety.

BACKGROUND

1. Technical Field

Various embodiments relate to a semiconductor memory device including a control circuit for controlling a read operation to reduce a read disturbance.

2. Related Art

A phase change memory (PCM) device using a material having a variable resistance characteristic is being developed. The resistance of the material varies depending on a crystal structure of the material.

For example, in a PCM device, when a memory cell is in a crystalline state, it has a smaller resistance value than in an amorphous state.

FIG. 1 illustrates a read operation of a phase change memory device that includes a memory cell including a phase change material.

In FIG. 1, the horizontal axis represents a voltage (or a cell voltage) applied to the memory cell and the vertical axis represents a current (or a cell current) flowing through the memory cell.

A read voltage $V_{READ}$ is applied to the memory cell in the read operation. The read voltage $V_{READ}$ is higher than a set threshold voltage $V_{th,SET}$ and lower than a reset threshold voltage $V_{th,RST}$.

When the phase change material in the memory cell is in an amorphous state, the cell current increases along lines (2) and (4) as the cell voltage increases, and thus the cell current remains lower than a threshold current $I_{th}$ when the cell voltage reaches the read voltage $V_{READ}$.

On the other hand, when the phase change material in the memory cell is in a crystalline state, the cell current increases along lines (2) and (3) as the cell voltage increases. Therefore, a snapback phenomenon (or snapback) occurs after the cell current reaches the threshold current $I_{th}$, so that the cell current increases rapidly along a line (1).

The reciprocal of a slope of the line (1) corresponds to a turn-on resistance of the phase change material.

When the phase change material is in the crystalline state, a relatively large cell current flows after the snapback. Such a large cell current generates heat, and thus the crystal structure of the phase change material may be changed by the generated heat.

When such a read operation is repeatedly performed on the memory cell including the phase change material, the crystal structure of the phase change material may be changed, thereby resulting in a read disturbance.

SUMMARY

In accordance with an embodiment of the present disclosure, a semiconductor device may include a bitline driver configured to drive a global bitline; a memory cell array including a first memory cell that is coupled between a cell wordline and a cell bitline; a bitline decoder including a bitline switch that couples the global bitline and the cell bitline; a wordline decoder including a wordline switch that couples a global wordline and the cell wordline; a sense amplifier configured to output a sensing signal corresponding to a state of the first memory cell based on a voltage of the global bitline; and a control circuit configured to control the bitline driver, the bitline decoder, the wordline decoder and the sense amplifier during a first read operation for the first memory cell.

In accordance with an embodiment of the present disclosure, a semiconductor device may include a memory cell array including a memory cell that is coupled between a cell wordline and a cell bitline, a bitline decoder including a bitline switch for coupling a global bitline and the cell bitline, and a sense amplifier configured to detect a resistance state of the memory cell based on a voltage of the global bitline, a bitline driver configured to couple the global bitline to a supply voltage terminal to precharge the global bitline and then decouple the global bitline from the supply voltage terminal before the global bitline is coupled to the cell bitline.

BRIEF DESCRIPTION OF THE DRAWINGS

The accompanying figures, where like reference numerals refer to identical or functionally similar elements throughout the separate views, together with the detailed description below are incorporated in and form part of the specification, serve to further illustrate embodiments of inventive concepts that include the claimed novelty, and explain various principles and advantages of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 2:
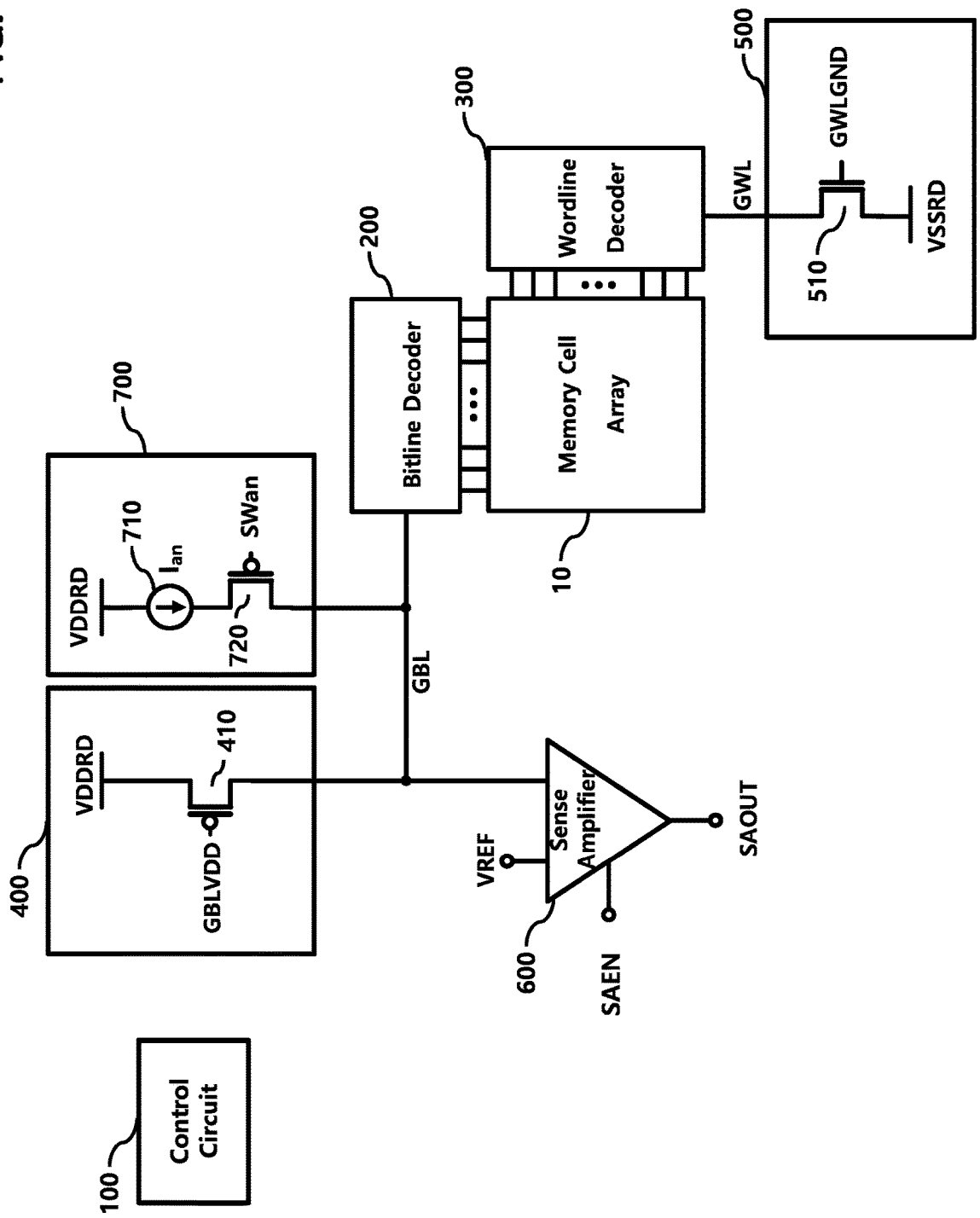
FIG. 2 illustrates a semiconductor memory device according to an embodiment of the present disclosure.
Figure 3:
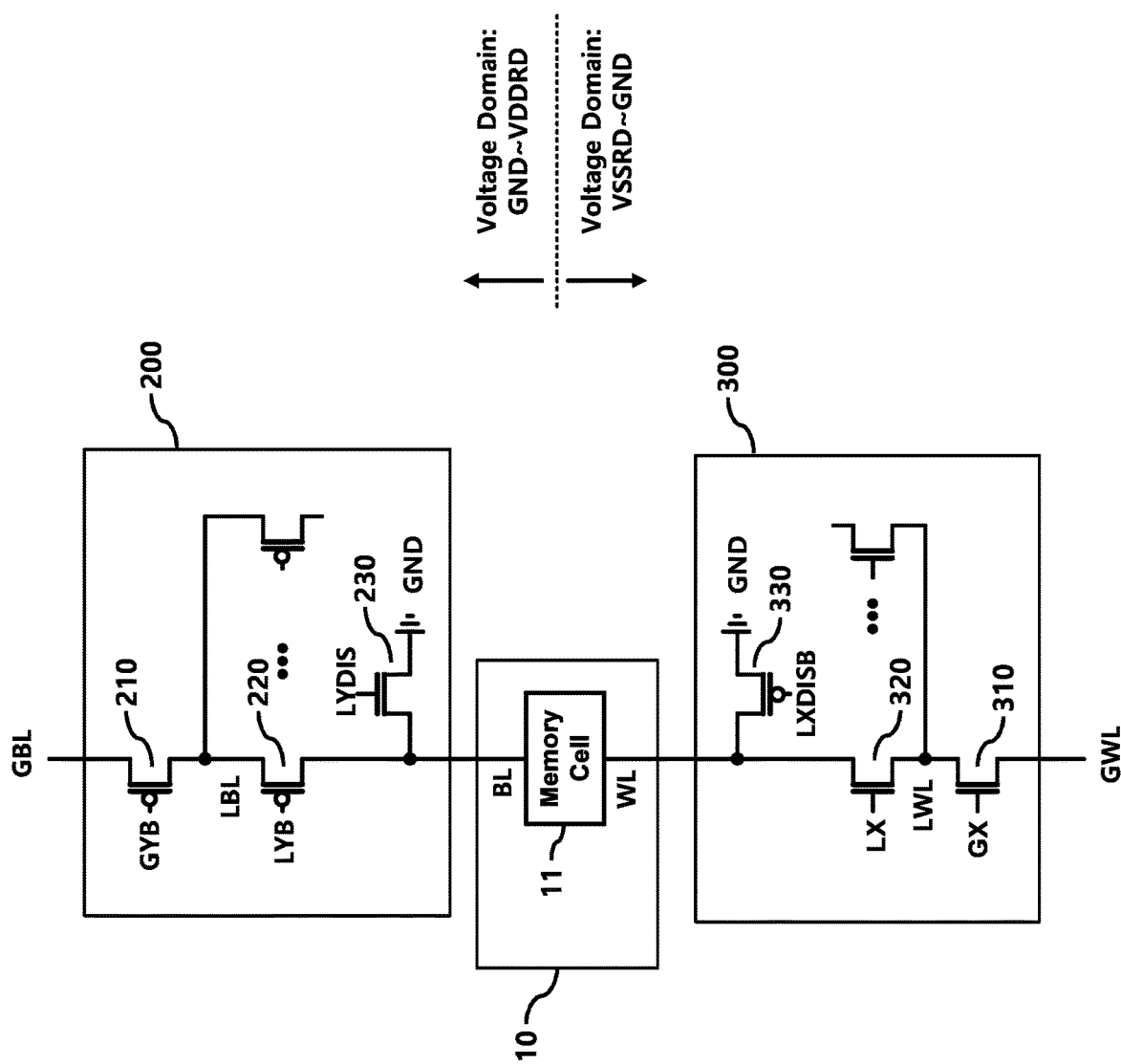
FIG. 3 illustrates a cell array, a bitline decoder, and a wordline decoder according to an embodiment of the present disclosure.

FIG. 2 illustrates a semiconductor memory device according to an embodiment of the present disclosure, and FIG. 3 illustrates a memory cell array 10, a bitline decoder 200 and a wordline decoder 300 in the semiconductor memory device of FIG. 2 according to an embodiment of the present disclosure.

The semiconductor memory device includes the memory cell array 10, a control circuit 100, the bitline decoder 200, the wordline decoder 300, a bitline driver 400, a wordline driver 500, a sense amplifier 600, and an annealing driver 700.

The memory cell array 10 includes a plurality of memory cells, and each memory cell, e.g., a memory cell 11 shown in FIG. 3, is coupled between a cell bitline BL and a cell wordline WL. For example, a memory cell may include a phase change material, but embodiments of the present disclosure are not limited thereto.

The control circuit 100 may control a read operation by providing control signals to other components in FIG. 2 such as the bitline decoder 200, the wordline decoder 300, the bitline driver 400, the wordline driver 500, the sense amplifier 600, and the annealing driver 700.

Various kinds of control signals mentioned below are provided from the control circuit 100 to the above other components in FIG. 2 unless otherwise stated.

In an embodiment, the semiconductor memory device may have a hierarchical bitline structure including a high-level global bitline GBL and a low-level local bitline LBL as shown in FIG. 3.

Referring to FIG. 2, the bitline driver 400 controls a voltage of the global bitline GBL. In an embodiment, the bitline driver 400 includes a PMOS transistor 410. The PMOS transistor 410 has a gate receiving a control signal GBLVDD, and a source and a drain coupled between a positive power supply voltage terminal VDDRD and the global bitline GBL.

Referring to FIG. 3, the bitline decoder 200 controls switches for coupling the global bitline GBL to the local bit line LBL and coupling the local bit line LBL to a cell bitline BL to which the memory cell 11 is coupled.

In an embodiment, the semiconductor memory device may have a hierarchical wordline structure including a high-level global wordline GWL and a low-level local wordline LWL as shown in FIG. 3.

The wordline decoder 300 controls switches for coupling the local wordline LWL to the global wordline GWL and coupling the local wordline LWL to a cell wordline WL to which the memory cell 11 is coupled.

Referring to FIG. 2, the wordline driver 500 controls a voltage of the global wordline GWL. In an embodiment, the wordline driver 500 includes an NMOS transistor 510. The NMOS transistor 510 has a gate receiving a control signal GWLGND, and a source and a drain coupled between a negative power supply voltage terminal VSSRD and the global wordline GWL.

The sense amplifier 600 amplifies the voltage of the global bitline GBL and outputs a sensing signal SAOUT indicating a state of the memory cell 11.

In an embodiment, the sense amplifier 600 operates according to a control signal SAEN and outputs the sensing signal SAOUT by comparing the voltage of the global bitline GBL with a reference voltage VREF.

The annealing driver 700 provides an annealing current $I_{an}$ to the global bitline GBL in response to a control signal SWan.

In an embodiment, the annealing driver 700 provides a small current for a long time to protect a crystalline state of the memory cell 11 when a snapback occurs while reading the memory cell 11 in a set state that corresponds to the crystalline state or a low resistance state, In an embodiment, the annealing driver 700 includes an annealing current source 710 and a PMOS transistor 720 coupled between the positive power supply voltage terminal VDDRD and the global bitline GBL.

The annealing current source 710 provides the annealing current $I_{an}$, and the PMOS transistor 720 has a gate receiving the control signal SWan, and a source and a drain coupled between the annealing current source 710 and the global bitline GBL.

Referring to FIG. 3, the bitline decoder 200 includes a global bitline switch 210 and a plurality of local bitline switches 220 coupled in parallel to the global bitline switch 210 through the local bitline LBL. The bitline decoder 200 may further include a bitline discharge switch 230 coupled to a corresponding one of the plurality of local bitline switches 220.

The control circuit 100 controls the bitline driver 400 to control the voltage of the global bitline GBL in the read operation.

The control circuit 100 controls the global bitline switch 210 using a global bitline control signal GYB to couple the global bitline GBL to the local bitline LBL.

The control circuit 100 controls the local bitline switch 220 using a local bitline control signal LYB to couple the local bitline LBL to the cell bitline BL.

The control circuit 100 may control the bitline discharge switch 230 using a bitline discharge control signal LYDIS to ground the cell bitline BL.

In an embodiment, the global bitline switch 210 is a transistor (e.g., a PMOS transistor). The transistor has a control terminal (e.g., a gate) to which the global bitline control signal GYB is applied, a first terminal (e.g., a source) coupled to the global bitline GBL, and a second terminal (e.g., a drain) coupled to the local bitline LBL.

In an embodiment, the local bitline switch 220 is a transistor (e.g., a PMOS transistor). The transistor has a control terminal (e.g., a gate) to which the local bitline control signal LYB is applied, a first terminal (e.g., a source) coupled to the local bitline LBL, and a second terminal (e.g., a drain) coupled to the cell bitline BL.

In an embodiment, the bitline discharge switch 230 is a transistor (e.g., an NMOS transistor). The transistor has a control terminal (e.g., a gate) to which the bitline discharge control signal LYDIS is applied, and is coupled to and disposed between the cell bitline BL and a ground voltage terminal GND.

The wordline decoder 300 includes a global wordline switch 310 and a plurality of local wordline switches 320 coupled in parallel to the global wordline switch 310 through the local wordline LWL. The wordline decoder 300 may further include a wordline discharge switch 330 coupled to a corresponding one of the plurality of local wordline switches 320.

The control circuit 100 controls the global wordline switch 310 using a global wordline control signal GX to couple the global wordline GWL to the local wordline LWL.

The control circuit 100 controls the local wordline switch 320 using a local wordline control signal LX to couple the local wordline LWL to the cell wordline WL.

The control circuit 100 may control the wordline discharge switch 330 using a wordline discharge control signal LXDISB to ground the cell wordline WL.

In an embodiment, the global wordline switch 310 is a transistor (e.g., an NMOS transistor). The transistor has a control terminal (e.g., a gate) to which the global wordline control signal GX is applied, a first terminal (e.g., a source) coupled to the global wordline GWL, and a second terminal (e.g., a drain) coupled to the local wordline LWL.

In an embodiment, the local wordline switch 320 is a transistor (e.g., an NMOS transistor). The transistor has a control terminal (e.g., a gate) to which the local wordline control signal LX is applied, a first terminal (e.g., a source) coupled to the local wordline LWL, and a second terminal (e.g., a drain) coupled to the cell wordline WL.

In an embodiment, the wordline discharge switch 330 is a transistor (e.g., a PMOS transistor). The transistor has a control terminal (e.g., a gate) to which the wordline discharge control signal LXDISB is applied, and is coupled to and disposed between the cell wordline WL and the ground voltage terminal GND.

In the embodiment of FIG. 3, a first portion above the memory cell 11 operates in a first voltage domain ranging from a ground voltage GND to a positive power supply voltage VDDRD, and a second portion under the memory cell 11 operates in a second voltage domain ranging from a negative power supply voltage VSSRD to the ground voltage GND.

Hereinafter, the positive power supply voltage VDDRD may be referred to as a positive voltage or a first power supply voltage, and the negative power supply voltage VSSRD may be referred to as a negative voltage or a second power supply voltage.

The voltages of the global bitline GBL, the local bitline LBL, and the control signals used in the first portion above the memory cell 11 vary between the positive voltage VDDRD, which corresponds to a first level (e.g., a high level), and the ground voltage GND, which corresponds to a second level (e.g., a low level). For example, the control signals used in the first portion above the memory cell 11 include the global bitline control signal GYB, the local bitline control signal LYB, and the bitline discharge control signal LYDIS.

One or more of the voltages of the local wordline LWL, the global wordline GWL, and the control signals used in the second portion below the memory cell 11 vary between the ground voltage GND, which corresponds to a first level (e.g., a high level), and the negative voltage VSSRD, which corresponds to a second level (e.g., a low level). For example, the control signals used in the second portion below the memory cell 11 include the global wordline control signal GX, the local wordline control signal LX, and the wordline discharge control signal LXDISB.

In the embodiment, the control circuit 100 operates to rapidly reduce a snapback current which flows through the memory cell 11 in the set state in the read operation, thereby substantially addressing the read disturbance.

An operation of the control circuit 100 will be described below in more detail.

FIGS. 4 to 9 are timing diagrams showing operations of the control circuit 100 of FIG. 2 for controlling a read operation of a memory cell.

In the timing diagrams of FIGS. 4 to 9, a high level and a low level follow the voltage domain rule described above with reference to FIG. 3.

For example, a first low level corresponds to the ground voltage GND, a first high level corresponds to the positive voltage VDDRD for the voltage of the global bitline GBL, a second low level corresponds to the negative voltage VSSRD, and a second high level corresponds to the ground voltage GND.

Figure 4:
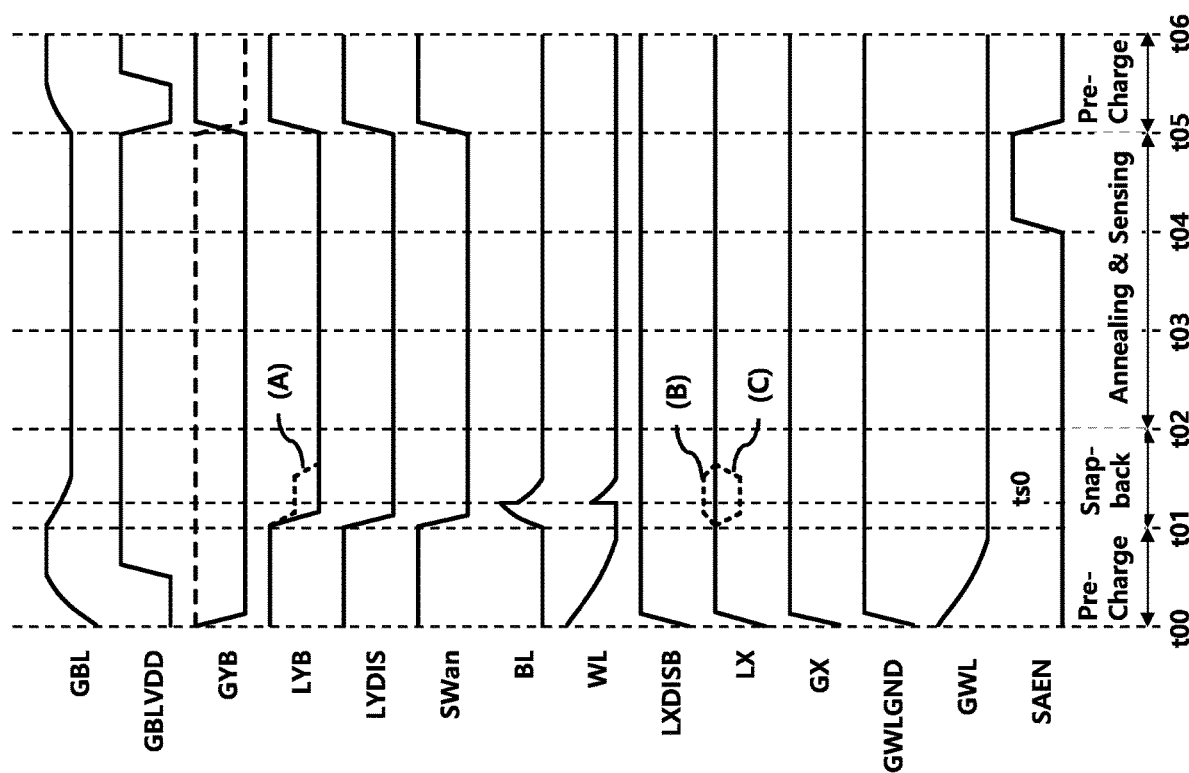
FIGS. 4 to 9 illustrate operations of a control circuit according to an embodiment of the present disclosure.

FIG. 4 illustrates a read operation of the control circuit 100 of FIG. 2 for the memory cell 11 in FIG. 3 programmed to a first state (e.g., a set state or a crystalline state) according to an embodiment.

A time section between t00 and t01 is referred to as a precharge stage for a first read operation of a first memory cell, e.g., the memory cell 11.

In the precharge stage, the voltage of the global bitline GBL is precharged to a first high level corresponding to the positive voltage VDDRD before initiating the first read operation.

The control circuit 100 sets the control signal GBLVDD to a low level and then to a high level. Accordingly, the bitline driver 400 precharges the global bitline GBL to the first high level and then floats the global bitline GBL to keep the voltage thereof at the first high level.

The control circuit 100 sets the global bitline control signal GYB to a low level, the local bitline control signal LYB to a high level, and the bitline discharge control signal LYDIS to a high level.

Accordingly, the local bitline LBL and the global bitline GBL are precharged, and the cell bitline BL is discharged to a first low level corresponding to the ground voltage GND.

In another embodiment, the local bitline LBL may not be precharged, and in this case, the global bitline control signal GYB may maintain the first high level in the precharge stage.

The control circuit 100 sets the control signal GWLGND to a high level. As a result, the voltage of the global wordline GWL falls to a second low level corresponding to the negative voltage VSSRD.

The control circuit 100 sets the global wordline control signal GX, the local wordline control signal LX, and the wordline discharge control signal LXDISB to a high level.

Accordingly, the cell wordline WL is coupled to the local wordline LWL and the global wordline GWL, and a voltage of the cell wordline WL falls to the second low level.

In the precharge stage, the control signal SWan is set to a high level and the control signal SAEN is set to a low level so that the sense amplifier 600 and the annealing driver 700 do not operate.

A time section between t01 to t02 is referred to as a snapback stage.

In the snapback stage, the memory cell 11 is coupled to the global bitline GBL and the global wordline GWL, and thus a cell current flows though the memory cell 11.

At this time, a snapback phenomenon occurs in the memory cell 11 that is in the set state.

The snapback phenomenon occurs at ts0 which is between t01 and t02.

At t01, the control circuit 100 sets the local bitline control signal LYB and the bitline discharge control signal LYDIS to a low level.

In the precharge stage, the global bitline GBL is decoupled from the first power supply voltage VDDRD because the control signal GBLVDD having a high level is provided to the bitline driver 400 and the control signal SWan having a high level is provided to the annealing driver 700.

After that, in the snapback stage, since the bitline discharge control signal LYDIS is set to a low level, the cell bitline BL is separated from the ground terminal GND, and, since the local bitline control signal LYB is set to a low level while the global bitline control signal GYB maintains the low level, the global bitline GBL and the cell bitline BL are coupled to each other. As a result, the precharged voltage of the global bitline GBL falls and a voltage of the cell bitline BL rises gradually by charge sharing therebetween.

At this time, since the memory cell 11 is turned off until the snapback occurs, a voltage of the cell wordline WL maintains the same low level as the voltage of the global wordline GWL.

When the snapback phenomenon occurs at ts0, the cell current increases rapidly, the voltage of the cell wordline WL increases momentarily, and a snapback current flows through the memory cell 11 while charges precharged in the global bitline GBL and the local bitline LBL are discharged.

The voltages of the cell bitline BL and the cell wordline WL fall instantaneously as the charges are discharged to the second power supply voltage terminal VSSRD through the memory cell 11 and the wordline driver 500.

The voltage of the global bitline GBL falls further with the discharging.

The control circuit 100 operates the annealing driver 700 by changing the control signal SWan to a low level in the snapback stage.

Figure 1:
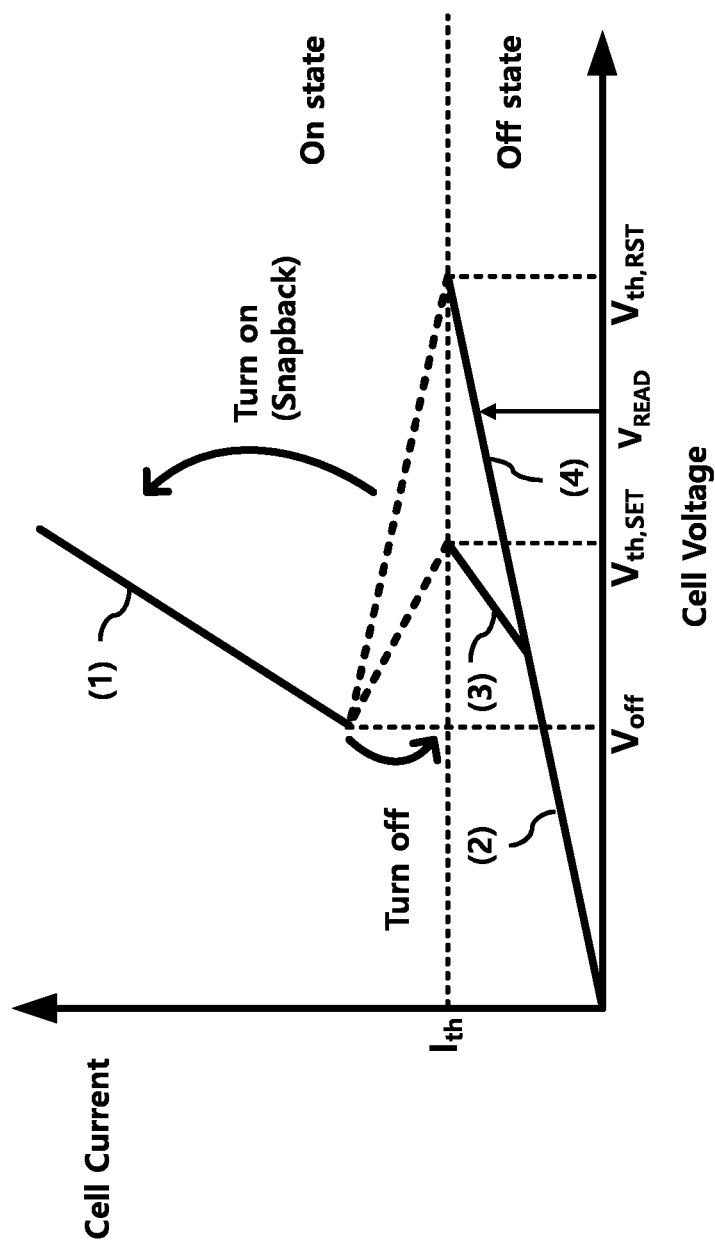
FIG. 1 illustrates a read operation of a semiconductor memory device.

The magnitude of the annealing current $I_{an}$ provided by the annealing current source 710 is set to be substantially the same as or slightly higher than that of the threshold current $I_{th}$ of FIG. 1, and is in a range between one hundredth and one tenth of a peak value of the snapback current flowing immediately after the snapback phenomenon occurs.

After the snapback phenomenon occurs, the cell current flowing in the memory cell 11 converges with the annealing current $I_{an}$ to stabilize the crystal structure of the memory cell 11.

In the snapback stage, the bitline decoder 200 and the wordline decoder 300 may be controlled to control the peak value and/or duration of the snapback current when the snapback phenomenon occurs.

For example, in FIG. 4, (A) corresponds to a case in which the local bitline switch 220 is weakly turned on, and (C) corresponds to a case in which the local wordline switch 320 is weakly turned on. In these cases, the magnitude of the peak current flowing through the memory cell 11 may be reduced, but a time for which the snapback current flows may be increased.

For example, in FIG. 4, (B) corresponds to a case where the local wordline switch 320 is strongly turned on.

In this case, the peak value of the snapback current flowing through the memory cell 11 may increase, but instead, the time that the snapback current flows may be reduced.

In the present embodiment, since the read operation is performed by discharging charges of the global bitline GBL that have been precharged in the precharge stage while the global bitline GBL is floated, the snapback current may be greatly reduced.

In addition, in the present embodiment, the magnitude of the control signals applied to the bitline decoder 200 or the wordline decoder 300 may be controlled to further reduce the magnitude of the snapback current or to further reduce the duration of the snapback current.

A time section between t02 and t05 is referred to as an annealing and sensing stage.

In a time section between t02 and t05, the annealing current $I_{an}$ is provided to the global bitline GBL after the snapback phenomenon occurs to protect the set state, i.e., the crystalline state, of the memory cell 11 while maintaining a state at the end of the snapback stage. The annealing current $I_{an}$ may begin to be provided to the global bitline GBL at t01 right before the snapback phenomenon occurs at ts0.

When the control signal SAEN is activated at t04, the sense amplifier 600 outputs a sensing signal SAOUT corresponding to the crystalline state of the memory cell 11 by comparing the voltage of the global bitline GBL and the reference voltage VREF.

When the memory cell 11 has the crystalline state, the voltage of the global bitline GBL is less than the reference voltage VREF.

After t05, a second read operation are consecutively performed on a second memory cell coupled to the same wordline as the first memory cell and coupled to a different bitline from the first memory cell.

A time section between t05 and t06 is referred to as a precharge stage for the second read operation.

A level of a global bitline control signal GYB corresponding to the bitline to which the second memory cell is coupled is indicated by a dotted line in FIG. 4.

In the precharge stage for the second read operation, the other control signals than the global bitline control signal GYB have substantially the same levels as in the precharge stage between t00 and t01, and thus descriptions thereof are omitted.

Figure 5:
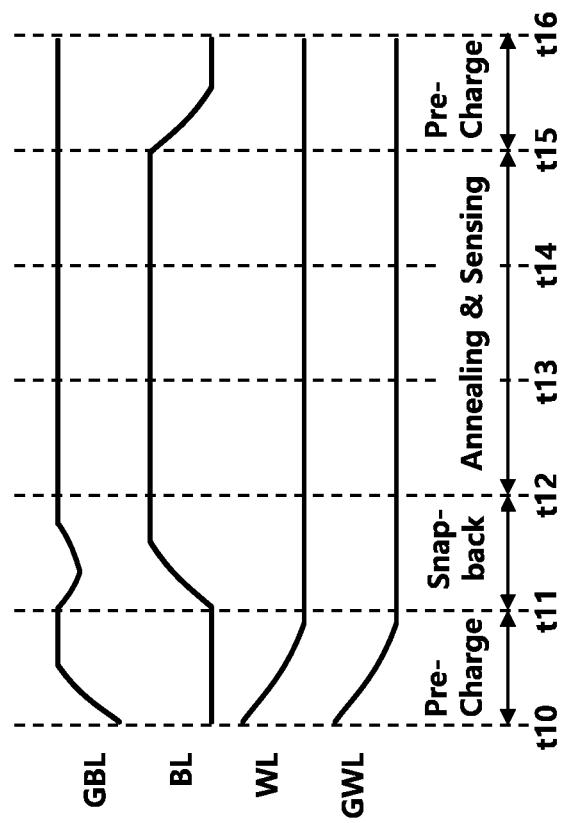

FIG. 5 illustrates a read operation of the control circuit 100 of FIG. 2 for the memory cell 11 in FIG. 3 programmed to a second state (e.g., a reset state or an amorphous state) according to an embodiment.

Because the control signals in FIG. 5 are set to have the same levels as shown in FIG. 4, detailed descriptions for the control signals are omitted. Times t10 to t16 in FIG. 5 may correspond to the times t0 to t6 in FIG. 4.

A time section between t10 and t11 indicates a precharge stage where substantially the same operation as the precharge stage of the time section between t00 and t01 of FIG. 4 is performed.

That is, in the precharge stage, the global bitline GBL rises up to a high level, the cell bitline BL maintains the ground voltage GND, and voltages of the cell wordline WL and the global wordline GWL fall to the second low level VSSRD from the ground voltage GND.

A time section between t11 and t12 correspond to a snapback stage.

In the snapback stage, since the memory cell 11 is in the reset state, a snapback phenomenon does not occur.

When the local bitline control signal LYB is set to a low level at t11, the voltage of the global bitline GBL is temporarily reduced and the voltage of the cell bitline BL is increased by charge sharing therebetween.

At this time, since the capacitance of the global bitline GBL and the local bitline LBL is relatively larger than that of the cell bitline BL, a voltage drop of the global bitline GBL is relatively small.

After the charge sharing is completed, the annealing current $I_{an}$ is provided so that voltages of the global bitline GBL and the cell bitline BL rise up to a high level.

A time section between t12 and t15 corresponds to an annealing and sensing stage.

The annealing current $I_{an}$ is provided to the global bitline GBL in a time section between t12 and t14 before the sense amplifier 600 is activated. In a time section between t14 and t15, the sense amplifier 600 is activated and amplifies a difference between the voltage of the global bitline GBL and the reference voltage VREF.

At this time, when the memory cell 11 is in the reset state, the voltage of the global bitline GBL is greater than the reference voltage VREF.

A time section between t15 and t16 correspond to a precharge stage for a memory cell coupled to the next bitline during the next read operation.

At this time, the voltage of the global bitline GBL maintains a high level, and the cell bitline BL is grounded and thus discharged to a low level. The voltages of the cell wordline WL and the global wordline GWL are kept at the second low level VSSRD.

Figure 6:
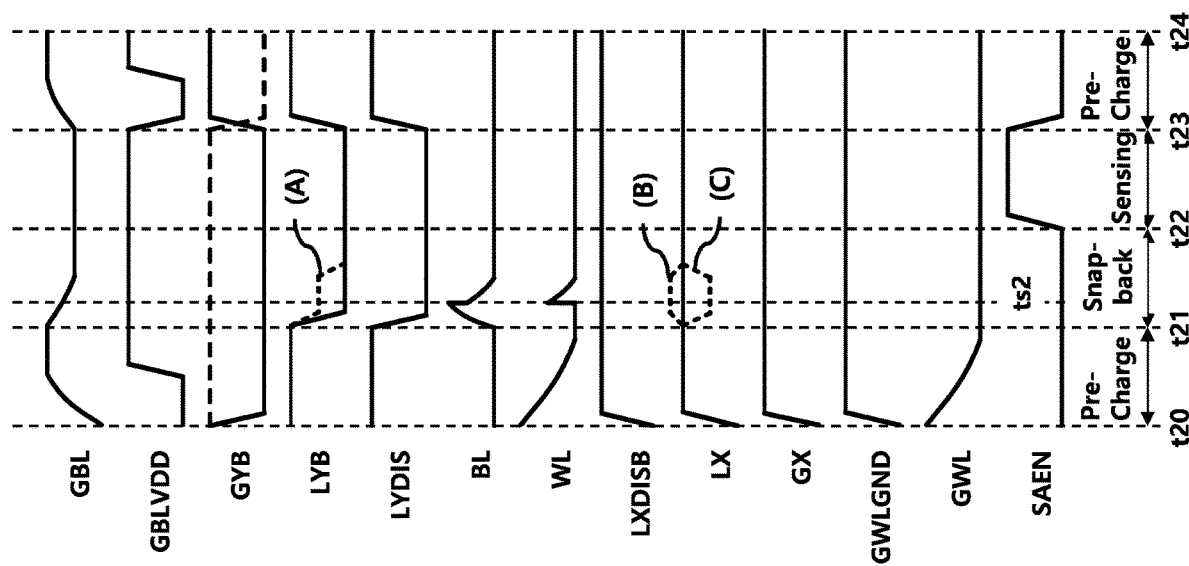

FIG. 6 illustrates a read operation of the control circuit 100 of FIG. 2 for the memory cell 11 in FIG. 3 programmed to the set state. The timing diagram of FIG. 6 differs from the timing diagram of FIG. 4 in that no annealing current is provided to the global bitline GBL.

A time section between t20 and t21 corresponds to a precharge stage which is the same as the precharge stage between t00 and t01 in FIG. 4, and therefore a detailed description thereof is omitted.

A time section between t21 and t22 corresponds to a snapback stage which is the same as the snapback stage between t01 and t02 in FIG. 4, and therefore a detailed description thereof is omitted.

However, since the annealing current $I_{an}$ is not provided to the global bitline GBL in the snapback stage in FIG. 6, a speed at which the voltage of the cell bitline BL rises up until the snapback phenomenon occurs at ts2 may be slightly slower than that in FIG. 4.

However, since the magnitude of the annealing current $I_{an}$ is set to a very small value as described above in FIG. 4, a time difference between ts0 and ts2 at which the snapback phenomenon occurs is insignificant.

A time section between t22 and t23 corresponds to a sensing stage which is the same as the sensing stage between t04 and t05 in FIG. 4, and therefore a detailed description thereof is omitted.

A time section between t23 and t24 corresponds to a precharge stage for a consecutive read operation which is the same as the time section between t05 and t06 in FIG. 4, and therefore a detailed description thereof is omitted.

Figure 7:
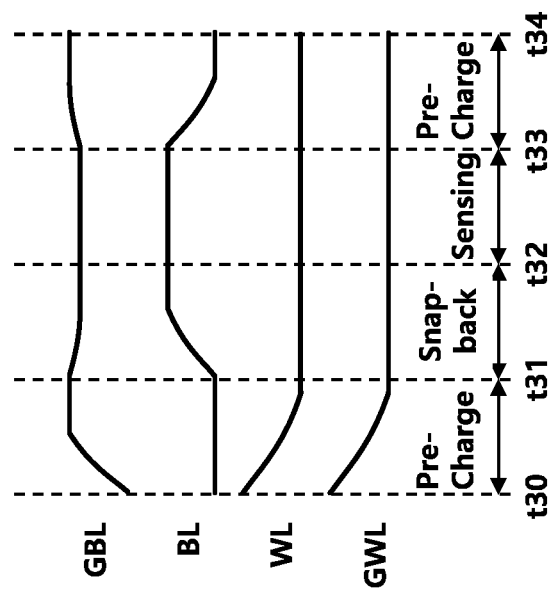

FIG. 7 illustrates a read operation of the control circuit 100 of FIG. 2 for the memory cell 11 in FIG. 3 programmed to the reset state.

The timing diagram of FIG. 7 differs from the timing diagram of FIG. 5 in that no annealing current is provided to the global bitline GBL.

A time section t30 and t31 corresponds to a precharge stage which is the same as the precharge stage between t10 to t11 of FIG. 5, and therefore a detailed description thereof is omitted.

A time section between t31 and t32 corresponds to a snapback stage which is the same as the snapback stage between t11 and t12 in FIG. 5, and therefore detailed description thereof is omitted.

Since the annealing current $I_{an}$ is not provided in the snapback stage in FIG. 7, a speed at which the voltage of the cell bitline BL rises up may be slightly slower than that in FIG. 5.

However, since the magnitude of the annealing current $I_{an}$ is set to a very small value as described above, a difference in voltage fluctuation may be insignificant.

A time section between t32 and t33 corresponds to a sensing stage which is the same as the sensing stage between t14 and t15 in FIG. 5, and therefore a detailed description thereof is omitted.

A time section between t33 and t34 corresponds to a precharge stage in a consecutive read operation which is the same as the precharge stage between t15 and t16 in FIG. 5, and therefore a detailed description thereof is omitted.

Figure 8:
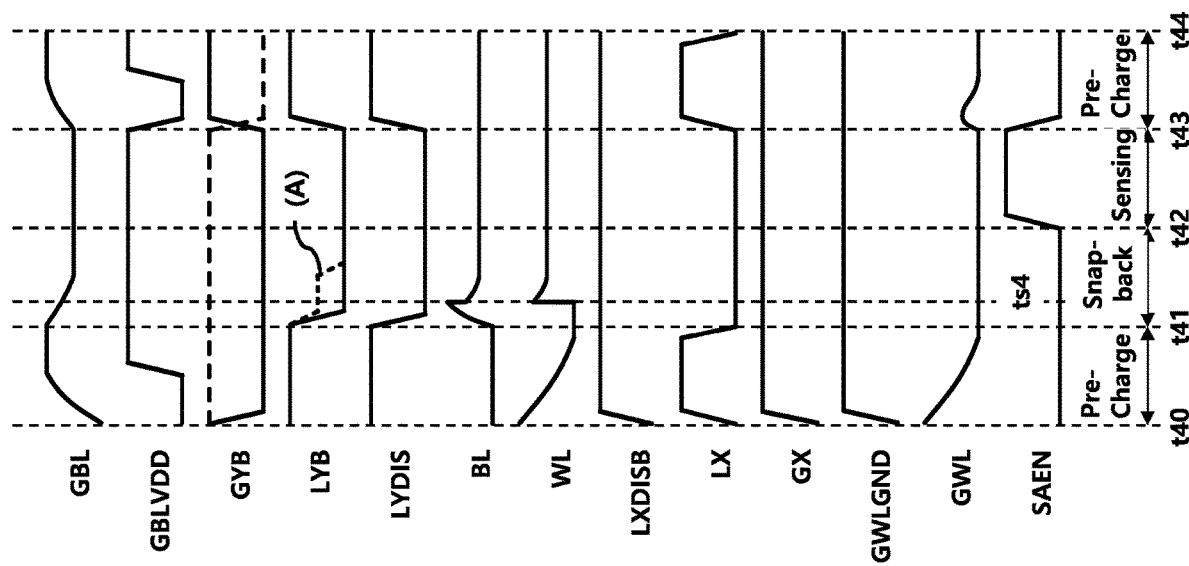

FIG. 8 illustrates a read operation of the control circuit 100 of FIG. 2 for the memory cell 11 in FIG. 3 programmed to the set state.

The timing diagram of FIG. 8 differs from the timing diagram of FIG. 4 in that no annealing current is provided to the global bitline GBL.

Moreover, the timing diagram of FIG. 8 is different from the timing diagram of FIG. 4 in that the local wordline control signal LX is set to a low level in a snapback stage and a sensing stage so that the cell wordline WL is floated in the snapback stage and the sensing stage.

A time section between t40 and t41 corresponds to a precharge stage which is the same as the precharge stage between t00 to t01 in FIG. 4, and therefore a detailed description thereof is omitted.

A time section between t41 and t42 corresponds to the snapback stage which is the same as the snapback stage between t01 and t02 in FIG. 4, and therefore a detailed description thereof is omitted.

However, in FIG. 8, since the annealing current $I_{an}$ is not provided to the global bitline GBL in the snapback stage, a speed at which the voltage of the cell bitline BL increases until the snapback occurs at ts4 may be slightly slower than that in FIG. 4.

However, since the magnitude of the annealing current $I_{an}$ is set to a very small value as described above in FIG. 4, a time difference between ts0 and ts4 at which the snapback phenomenon occurs is insignificant.

In addition, in FIG. 8, the local wordline control signal LX is set to the low level in the snapback stage, so that the cell wordline WL and the local wordline LWL are separated from each other and thus the cell wordline WL is floated.

As the cell wordline WL is floated, the capacitance of the cell wordline WL decreases as compared with the case of FIG. 4, so that the voltages of the cell bitline BL and the cell wordline WL converge to a relatively higher level than that in FIG. 4.

A time section between t42 and t43 corresponds to a sensing stage which is the same as the sensing stage between t04 and t05 in FIG. 4, and therefore a detailed description thereof is omitted.

However, in the sensing stage, the local wordline control signal LX maintains the low level and thus the cell wordline WL is kept at a floating state.

A time section between t43 and t44 corresponds to a precharge stage for a consecutive read operation which is the same as the precharge stage between t05 and t06 in FIG. 4, and thus a detailed description thereof is omitted.

However, in the precharge stage between t43 and t44, since the voltage of the local wordline control signal LX is changed from the low level to a high level, charges charged in the cell wordline WL in the sensing stage are shared with the local wordline LWL and the global wordline GWL, so that the voltage of the global wordline GWL temporarily rises up and then falls again.

Figure 9:
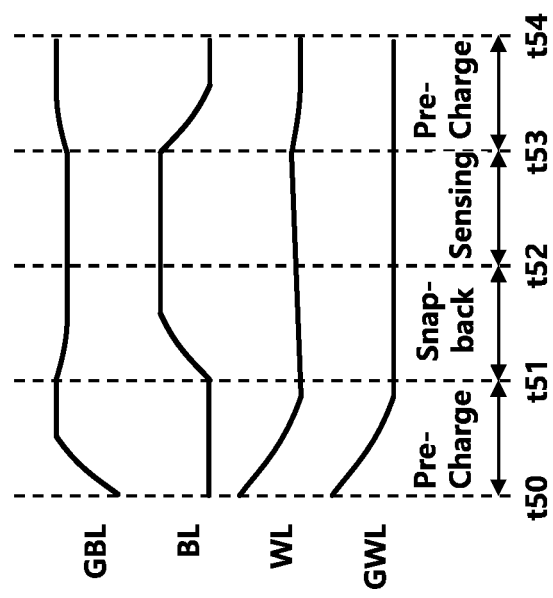

FIG. 9 illustrates a read operation of the control circuit 100 of FIG. 2 for the memory cell 11 in FIG. 3 programmed to the reset state.

The timing diagram of FIG. 9 differs from the timing diagram of FIG. 5 in that no annealing current is provided to the global bitline GBL.

Moreover, the timing diagram of FIG. 9 differs from the timing diagram of FIG. 5 in that the local wordline control signal LX is set to a low level in a snapback stage and a sensing stage so that the cell wordline WL is floated in the snapback stage and the sensing stage.

A time section between t50 and t51 corresponds to a precharge stage which is the same as the precharge stage between t10 and t11 in FIG. 5, and therefore a detailed description thereof is omitted.

A time section between t51 and t52 corresponds to the snapback stage which is the same as the snapback stage between t11 and t12 in FIG. 5, and therefore a detailed description thereof is omitted.

However, since the annealing current $I_{an}$ is not provided to the global bitline GBL in the snapback stage, a speed at which the voltage of the cell bit line BL increases in the snapback step may be slightly slower than that in FIG. 5.

A time section between t52 and t53 corresponds to the sensing stage which is the same as the sensing stage between t14 and t15 in FIG. 5, and therefore a detailed description thereof is omitted.

However, in the snapback and sensing stages, since the local wordline control signal LX is set to the low level and thus the cell wordline WL is separated from the global wordline GWL, the voltage of the cell wordline WL may rise up slightly by a leakage current flowing through the memory cell 11.

A time section between t53 and t54 corresponds to a precharge stage in a consecutive read operation which is the same as the precharge stage between t15 and t16 in FIG. 5, and therefore a detailed description thereof is omitted.

However, in the precharge stage between t53 and t54, since the local wordline control signal LX is changed from the low level to a high level and charges charged in the cell wordline WL in the sensing stage is shared with the local wordline LWL and the global wordline GWL, the voltage of the global wordline GWL drops to a low level.

At this time, since an amount of charges charged in the cell wordline WL is small, the voltage variation of the global word line GWL is insignificant.

As described above, in the embodiments, the read operation is performed by precharging the global bitline GBL.

As a result, the snapback current flowing through the memory cell 11 when the snapback phenomenon occurs is attenuated very quickly, thereby reducing the possibility of damaging the crystal structure of the memory cell 11.

In the embodiments, there is an advantage that a time when the snapback phenomenon occurs does not change greatly depending on the location of a memory cell in a memory cell array.

This effect can be expected when only the global bitline is precharged or when the local bitline close to the memory cell as well as the global bitline are precharged together.

The time when the snapback phenomenon occurs may become more regular when the local bitline as well as the global bitline are precharged together.

When the read timing is fixed to a predetermined time, there is no need to change the timing condition during a consecutive read operation, thereby the consecutive read operation may be performed more easily.

Although various embodiments have been described for illustrative purposes, various changes and modifications may be possible.

What is claimed is:

1. A semiconductor memory device comprising:
   a bitline driver configured to drive a global bitline;
   a memory cell array including a first memory cell that is electrically connected between a cell wordline and a cell bitline;
   a bitline decoder including a bitline switch that electrically connects the global bitline and the cell bitline;
   a wordline decoder including a wordline switch that electrically connects a global wordline and the cell wordline;
   a sense amplifier configured to output a sensing signal corresponding to a state of the first memory cell based on a voltage of the global bitline; and
   a control circuit configured to control the bitline driver, the bitline decoder, the wordline decoder, and the sense amplifier during a first read operation for the first memory cell,
   wherein the control circuit electrically connects the global bitline to a first power supply terminal in order to precharge the global bitline, electrically disconnects the global bitline from the first power supply terminal after the global bitline is precharged, connects the global bitline and the cell bitline after the global bitline is electrically disconnected from the first power supply terminal, and then activates the sense amplifier, during the first read operation.

2. The semiconductor memory device of claim 1, wherein the wordline switch includes:
   a local wordline switch coupling the cell wordline and a local wordline; and
   a global wordline switch coupling the local wordline and the global wordline.

3. The semiconductor memory device of claim 2, wherein the wordline decoder further comprises a wordline discharge switch configured to discharge the cell wordline.

4. The semiconductor memory device of claim 2, wherein the control circuit turns on the global wordline switch and the local wordline switch while the global bitline is coupled to the cell bitline.

5. The semiconductor memory device of claim 4, wherein the control circuit adjusts a turn-on resistance of the local wordline switch while the global bitline is coupled to the cell bitline.

6. The semiconductor memory device of claim 1, wherein the bitline switch includes:
   a local bitline switch coupling the cell bitline and a local bitline; and
   a global bitline switch coupling the local bitline and the global bitline.

7. The semiconductor memory device of claim 6, wherein the bitline decoder further includes a bitline discharge switch configured to discharge the cell bitline.

8. The semiconductor memory device of claim 6, wherein the control circuit turns on the global bitline switch and turns off the local bitline switch while the global bitline is precharged by coupling the global bitline to the first power supply terminal.

9. The semiconductor memory device of claim 8, wherein the sense amplifier generates the sensing signal by comparing the voltage of the global bitline and a reference voltage during the first read operation.

10. The semiconductor memory device of claim 1, further comprising an annealing driver configured to provide an annealing current to the global bitline, wherein the control circuit controls so that the annealing current flows in the first memory cell while the global bitline is coupled to the cell bitline.

11. The semiconductor memory device of claim 1, wherein the control circuits controls the wordline decoder so that the cell wordline is decoupled from the global wordline while the global bitline is coupled to the cell bitline.

12. The semiconductor memory device of claim 1, wherein the memory cell array further comprises a second memory cell, and the control circuit begins a second read operation for detecting a state of the second memory cell by precharging the global bitline after finishing the first read operation for the first memory cell.

13. The semiconductor memory device of claim 1, further comprising a wordline driver configured to control a voltage of the global wordline.

14. The semiconductor memory device of claim 13, wherein the control circuit keeps the voltage of the global wordline at a predetermined level by controlling the wordline driver.

15. The semiconductor memory device of claim 14, wherein the wordline driver includes a transistor including a gate receiving a control signal from the control circuit and coupled between the global wordline and a second power supply.

16. A semiconductor memory device, comprising:
a memory cell array including a memory cell that is electrically connected between a cell wordline and a cell bitline;
a bitline decoder including a bitline switch for electrically connecting a global bitline and the cell bitline;
a sense amplifier configured to detect a resistance state of the memory cell based on a voltage of the global bitline; and
a bitline driver configured to electrically connect the global bitline to a supply voltage terminal to precharge the global bitline and then electrically disconnect the global bitline from the supply voltage terminal,
wherein the bitline decoder electrically connects the global bitline and the cell bitline after the global bitline is electrically disconnected from the supply voltage terminal.

17. The semiconductor memory device of claim 16, further comprising:
an annealing driver configured to provide an annealing current to the global bitline while the global bitline is electrically connected to the cell bitline.

\* \* \* \* \*